(12) United States Patent
Kim

(10) Patent No.: US 10,026,819 B2
(45) Date of Patent: Jul. 17, 2018

(54) HIGH VOLTAGE SEMICONDUCTOR DEVICES INCLUDING MAIN CONDUCTIVE PATTERN, AUXILIARY CONDUCTIVE PATTERN, AND SPACER THEREBETWEEN

(71) Applicant: Samsung Electronics Co., Ltd., Suwon-si, Gyeonggi-do (KR)

(72) Inventor: Myoungsoo Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/626,573

(22) Filed: Jun. 19, 2017

(65) Prior Publication Data

US 2018/0012970 A1    Jan. 11, 2018

(30) Foreign Application Priority Data

Jul. 8, 2016  (KR) .......................... 10-2016-0087000

(51) Int. Cl.
| | |
|---|---|
| *H01L 29/788* | (2006.01) |
| *H01L 29/423* | (2006.01) |
| *H01L 29/06* | (2006.01) |
| *H01L 29/08* | (2006.01) |
| *H01L 23/535* | (2006.01) |
| *H01L 29/49* | (2006.01) |

(Continued)

(52) U.S. Cl.
CPC ...... *H01L 29/42332* (2013.01); *H01L 23/535* (2013.01); *H01L 29/0649* (2013.01); *H01L 29/0847* (2013.01); *H01L 29/4933* (2013.01); *H01L 29/4991* (2013.01); *H01L 29/66825* (2013.01); *H01L 29/788* (2013.01); *H01L 21/32139* (2013.01); *H01L 29/0611* (2013.01); *H01L 29/1083* (2013.01); *H01L 29/6656* (2013.01)

(58) Field of Classification Search
CPC .......... H01L 29/42332; H01L 29/4991; H01L 29/0649; H01L 29/0847; H01L 29/66825; H01L 29/4933; H01L 23/535; H01L 29/788; H01L 21/32139; H01L 29/0611; H01L 29/1083; H01L 29/6656
USPC ................................ 438/197, 286, 301, 306
See application file for complete search history.

(56) References Cited

U.S. PATENT DOCUMENTS

| | | | |
|---|---|---|---|
| 7,446,387 B2 | 11/2008 | Kang et al. | |
| 7,875,938 B2 | 1/2011 | Liu et al. | |

(Continued)

FOREIGN PATENT DOCUMENTS

| | | |
|---|---|---|
| JP | 2013069845 A | 4/2013 |
| KR | 20100030411 A | 3/2010 |
| KR | 20140001087 A | 1/2014 |

*Primary Examiner* — Selim Ahmed
(74) *Attorney, Agent, or Firm* — Harness, Dickey & Pierce, P.L.C.

(57) ABSTRACT

The semiconductor device including a device isolation layer disposed in a substrate and defining an active region, a first conductive pattern on the active region, an impurity region in the active region on a side of the first conductive pattern, a second conductive pattern on the active region between the impurity region and the first conductive pattern, a first spacer between the first conductive pattern and the second conductive pattern, and a contact plug disposed on and electrically connected to the first conductive pattern may be provided. The second conductive pattern may have a width less than a width of the contact plug.

20 Claims, 8 Drawing Sheets

(51) Int. Cl.
  *H01L 29/66* (2006.01)
  *H01L 29/10* (2006.01)
  *H01L 21/3213* (2006.01)

(56) References Cited

U.S. PATENT DOCUMENTS

| | | |
|---|---|---|
| 8,058,129 B2 | 11/2011 | Lee |
| 8,138,545 B2 | 3/2012 | Lim |
| 8,143,677 B2 | 3/2012 | Kim |
| 8,304,831 B2 | 11/2012 | Zhu et al. |
| 8,614,484 B2 | 12/2013 | Teo et al. |
| 8,803,234 B1 * | 8/2014 | Liao .................. H01L 29/7833 257/335 |
| 8,936,980 B1 | 1/2015 | Zuniga et al. |
| 9,136,374 B2 | 9/2015 | Zhou et al. |
| 2006/0065928 A1 * | 3/2006 | Nagai .................. H01L 29/402 257/344 |
| 2012/0094457 A1 | 4/2012 | Gabrys |
| 2014/0110798 A1 * | 4/2014 | Cai ..................... H01L 29/78 257/410 |
| 2014/0239371 A1 | 8/2014 | Tan et al. |

* cited by examiner

HIGH VOLTAGE SEMICONDUCTOR DEVICES INCLUDING MAIN CONDUCTIVE PATTERN, AUXILIARY CONDUCTIVE PATTERN, AND SPACER THEREBETWEEN

CROSS-REFERENCE TO RELATED APPLICATIONS

This U.S. nonprovisional patent application claims priority under 35 U.S.C § 119 of Korean Patent Application 10-2016-0087000 filed on Jul. 8, 2016, the entire contents of which are hereby incorporated by reference.

BACKGROUND

The present inventive concepts relate to semiconductor devices, and more particularly to semiconductor devices including a high-voltage transistor.

Semiconductor devices include transistors of various dimensions, which are configured to operate in response to diverse voltages. A high-voltage transistor, which tends to have a relatively thick gate dielectric layer, is one such transistor. The high-voltage transistor has source/drain regions each having an LDD (lightly doped drain) or DDD (double doped drain) structure consisting of lightly and highly doped impurity ion implantation regions to mitigate or prevent a puchthrough phenomenon and/or to improve breakdown-related characteristics.

SUMMARY

Example embodiments of the present inventive concepts provide a semiconductor device that can be fabricated by simple processes.

According to an example embodiment of the present inventive concepts, a semiconductor device includes a device isolation layer disposed in a substrate and defining an active region, a first conductive pattern on the active region, an impurity region in the active region on a side of the first conductive pattern, a second conductive pattern on the active region between the impurity region and the first conductive pattern, a first spacer between the first conductive pattern and the second conductive pattern, and a contact plug disposed on and electrically connected to the first conductive pattern. The second conductive pattern may have a width less than a width of the contact plug.

According to an example embodiment of the present inventive concepts, a semiconductor device includes a device isolation layer disposed in a substrate and defining an active region, a gate conductive pattern on the active region; an impurity region in the active region on a side of the gate conductive pattern, a dummy conductive pattern on the active region between the impurity region and the gate conductive pattern, a first spacer between the gate conductive pattern and the dummy conductive pattern, and a gate dielectric layer between the gate conductive pattern and the active region. The gate dielectric layer may extend between the first spacer and the active region and between the dummy conductive pattern and the active region.

According to an example embodiment of the present inventive concepts, a semiconductor device includes a substrate including an active region, a gate conductive pattern on the active region, a first impurity region in the active region, the first impurity region including impurities of a first conductive type, a second impurity region in the active region, the second impurity region at one side of the gate conductive pattern and surrounding the first impurity region, the second impurity region including impurities of the first conductive type, the first impurity region having a greater impurity concentration than the second impurity region, at least one auxiliary conductive pattern on the active region, the at least one auxiliary conductive pattern between the first impurity region and the gate conductive pattern, the at least one auxiliary conductive pattern has a first width, a first spacer between the gate conductive pattern and the auxiliary conductive pattern, and a contact plug connected to the gate conductive pattern, the contact plug has a second width, the first width being smaller than the second width.

DETAILED DESCRIPTION OF EMBODIMENTS

Figure 1:
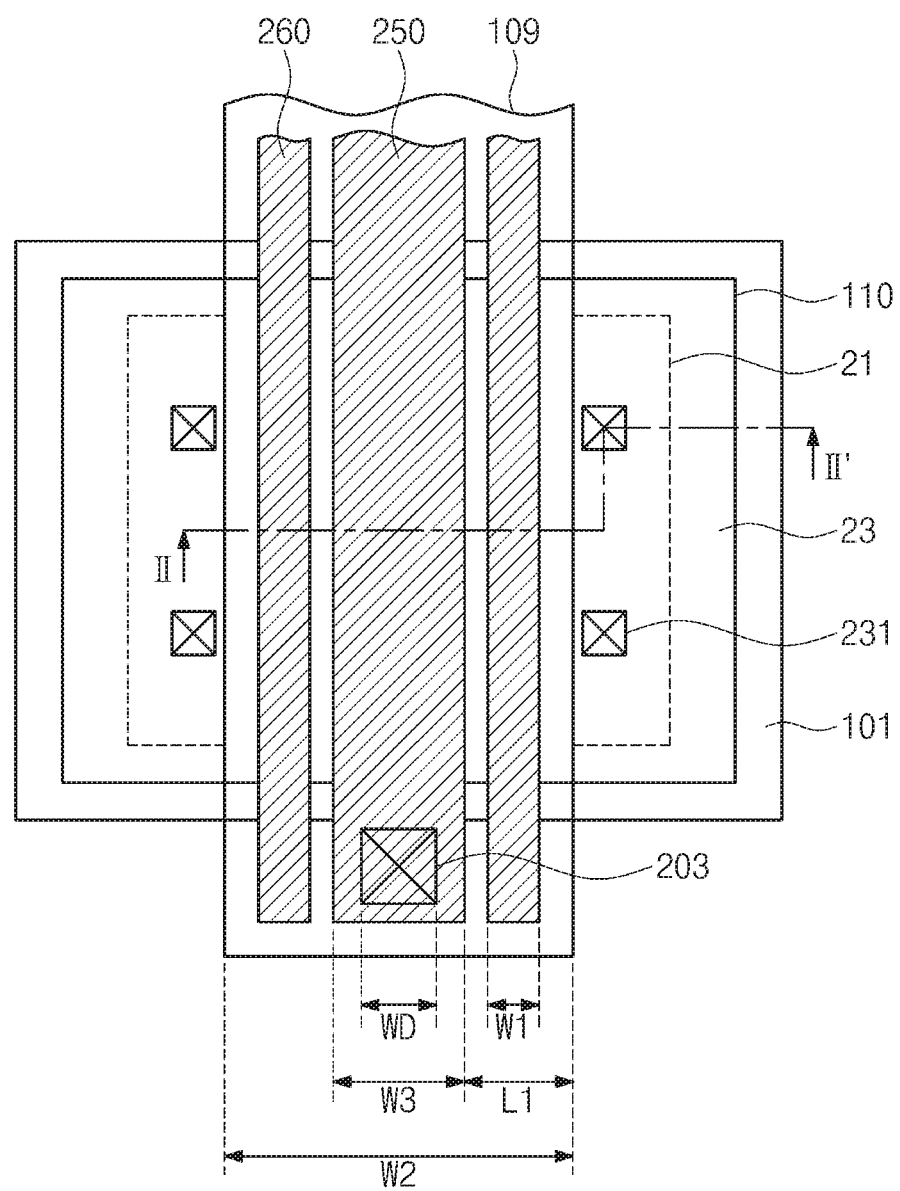
FIG. 1 is a plan view illustrating a semiconductor device according to an example embodiment of the present inventive concepts.
Figure 2:
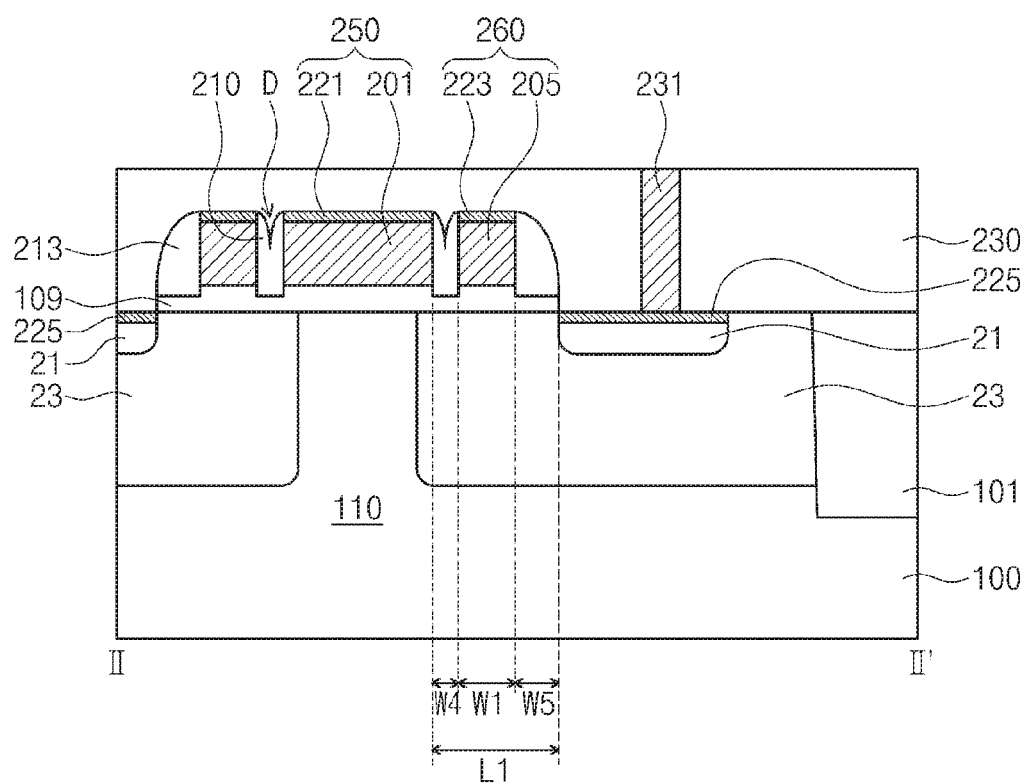
FIG. 2 is a cross-sectional view taken along line II-II' of FIG. 1 illustrating a semiconductor device according to an example embodiment of the present inventive concepts.
Figure 3:
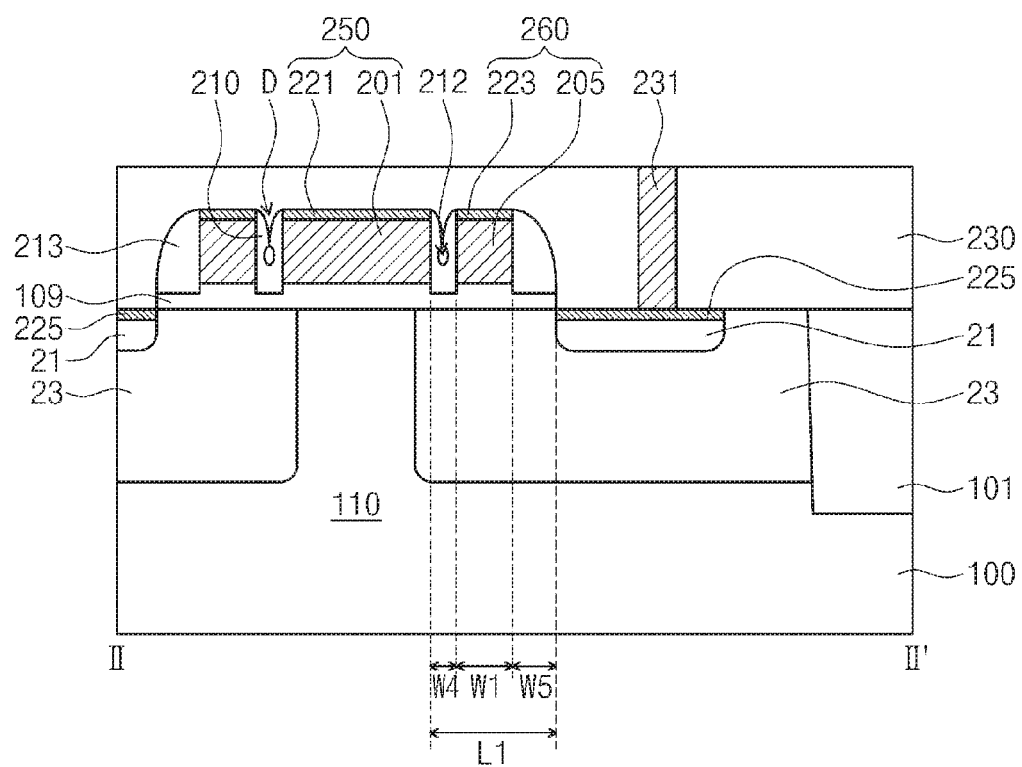
FIG. 3 is a cross-sectional view taken along line II-II' of FIG. 1 illustrating a semiconductor device according to an example embodiment of the present inventive concepts.

FIG. 1 is a plan view illustrating a semiconductor device according to an example embodiment of the present inventive concepts. FIG. 2 is a cross-sectional view taken along line II-II' of FIG. 1 illustrating a semiconductor device according to an example embodiment of the present inventive concepts. FIG. 3 is a cross-sectional view taken along line II-II' of FIG. 1 illustrating a semiconductor device according to an example embodiment of the present inventive concepts.

Referring to FIGS. 1 and 2, a substrate 100 may be provided therein with a device isolation layer 101 defining an active region 110. The substrate 100 may be doped with, for example, p-type conductive impurities. As not shown in figures, a well region may be disposed in the substrate 100. The device isolation layer 101 may include an insulative material (e.g., a silicon oxide layer or a silicon nitride layer).

A first impurity region 21 may be disposed in the active region 110. The first impurity region 21 may be doped with p-type or n-type conductive impurities. A second impurity region 23 may be disposed in the active region 110. The second impurity region 23 may surround the first impurity region 21. The second impurity region 23 may have a doping concentration less than that of the first impurity region 21. The second impurity region 23 may have the same conductivity as the first impurity region 21.

A gate conductive pattern 250 may be disposed on the active region 110. The first impurity region 21 may be disposed on a side of the gate conductive pattern 250. The gate conductive pattern 250 may include a first conductive pattern 201 and a first metal silicide pattern 221 on the first conductive pattern 201. The first impurity region 21 may be spaced apart at a distance L1 from the gate conductive pattern 250. Providing the distance L1 may mitigate or prevent a leak current and/or a punchthrough phenomenon between source and drain regions, and/or to enhance breakdown-related characteristics. The gate conductive pattern 250 may run across the active region 110. The first conductive pattern 201 may include, for example, undoped polysilicon, doped polysilicon, or metal. The first metal silicide pattern 221 may include, for example, titanium silicide, tantalum silicide, tungsten silicide, nickel silicide, or cobalt silicide. A first contact plug 203 may be disposed on the gate conductive pattern 250. The gate conductive pattern 250 may be supplied with a voltage through the first contact plug 203. The first contact plug 203 may include, for example, a conductive material (e.g., tungsten).

A dummy conductive pattern 260 may be disposed on the active region 110. The dummy conductive pattern 260 may be disposed on the active region 110 between the gate conductive pattern 250 and the first impurity region 21. The dummy conductive pattern 260 may include a second conductive pattern 205 and a second metal silicide pattern 223 on the second conductive pattern 205. The dummy conductive pattern 260 may run across the active region 110. For example, the gate conductive pattern 250 and the dummy conductive pattern 260 may be parallel to each other. The dummy conductive pattern 260 may have a thickness substantially the same as that of the gate conductive pattern 250.

The dummy conductive pattern 260 may have a width W1 less than a width WD of the first contact plug 203. For example, the width WD of the first contact plug 203 may correspond to a minimum width allowed to a contact plug. The width W1 of the dummy conductive pattern 260 may be in the range from about 0.01 μm to about 10 μm. No contact plug may be provided on the dummy conductive pattern 260. In other words, as the width W1 of the dummy conductive pattern 260 is less than the minimum width WD of the first contact plug 203, a contact plug may not be disposed on the dummy conductive pattern 260. The dummy conductive pattern 260 may be supplied with no voltage, and thus may be in an electrically floating state. The dummy conductive pattern 260 may include the same material as the gate conductive pattern 250. For example, the second conductive pattern 205 may include undoped polysilicon, doped polysilicon, or metal. The second metal silicide pattern 223 may include, for example, titanium silicide, tantalum silicide, tungsten silicide, nickel silicide, or cobalt silicide.

A first spacer 210 may be disposed between the gate conductive pattern 250 and the dummy conductive pattern 260. The first spacer 210 may have a width W4 substantially the same as a distance between the gate conductive pattern 250 and the dummy conductive pattern 260. For example, the width W4 of the first spacer 210 may be in the range from about 0.01 μm to about 0.5 μm. The first spacer 210 may include a recess D at its upper portion. The recess D may correspond to a recessed top surface of the first spacer 210. The recess D may be recessed toward the substrate 100. The recess may have a width whose size decreases with approaching the substrate 100. The recess D may have a V-type shape. For example, the recess D may be formed of convex inner surfaces facing each other. In an example embodiment, as shown in FIG. 3, the first spacer 210 may include a void 212. The void 212 may be closed or sealed by the first spacer 210. The void 212 may be filled with air. The first spacer 210 may include an insulative material (e.g., a silicon oxide layer or a silicon nitride layer).

A second spacer 213 may be disposed on the active region 110 between the dummy conductive pattern 260 and the first impurity region 21. The second spacer 213 may be disposed on a sidewall of the dummy conductive pattern 260. The second spacer 213 may include the same material (e.g., a silicon oxide layer or a silicon nitride layer) as the first spacer 210. For example, a sum of a width W5 of the second spacer 213, the width W4 of the first spacer 210, and the width W1 of the dummy conductive pattern 260 may be substantially the same as the distance L1 between the gate conductive pattern 250 and the first impurity region 21, i.e., $L1=W1+W4+W5$. In an example embodiment, as shown in FIG. 3, in the case the first spacer 210 includes the void 212, the second spacer 213 may include no void.

A gate dielectric layer 109 may be disposed between the active region 110 and each of the gate conductive pattern 250, the first spacer 210, the dummy conductive pattern 260, and the second spacer 213. The gate dielectric layer 109 may have a top surface in contact with the gate conductive pattern 250, the first spacer 210, the dummy conductive pattern 260, and the second spacer 213. The gate dielectric layer 109 may have a thickness whose size is greater between the active region 110 and each of the gate and dummy, conductive patterns 250 and 260 than between the active region 110 and each of the first and second spacers 210 and 213. The gate dielectric layer 109 may have a width W2 greater than a width W3 of the gate conductive pattern 250. The gate dielectric layer 109 may have a thickness large enough to endure high voltage. The gate dielectric layer 109 may include, for example, a thermal oxide layer.

A third metal silicide pattern 225 may be disposed on the first impurity region 21. The third metal silicide pattern 225 may include the same material as the first and second metal silicide patterns 221 and 223. The third metal silicide pattern 225 may include, for example, titanium silicide, tantalum silicide, tungsten silicide, nickel silicide, or cobalt silicide.

According to an example embodiment of the present inventive concepts, the dummy conductive pattern 260, the first spacer 210, and the second spacer 213 may serve as a mask for an ion implantation process forming the first impurity region 21 and for a silicidation process forming the first and third metal silicide patterns 221 and 225. Therefore, no mask alignment may be used to form the first impurity region 21 spaced apart at the distance L1 from the gate conductive pattern 250. Further, the first and third metal silicide patterns 221 and 225 may be formed on the gate conductive pattern 250 and the first impurity region 21, respectively, by a single silicidation process.

An interlayer dielectric layer 230 may be formed on the substrate 100. The interlayer dielectric layer 230 may cover the active region 110, the gate conductive pattern 250, the first spacer 210, the dummy conductive pattern 260, and the second spacer 213. For example, the interlayer dielectric layer 230 may fill the recess D of the first spacer 210. The interlayer dielectric layer 230 may include an insulative material (e.g., silicon oxide layer). A second contact plug 231 may be disposed in the interlayer dielectric layer 230. The second contact plug 231 may be electrically connected to the first impurity region 21. The second contact plug 231 may include a conductive material (e.g., tungsten).

Figure 4:
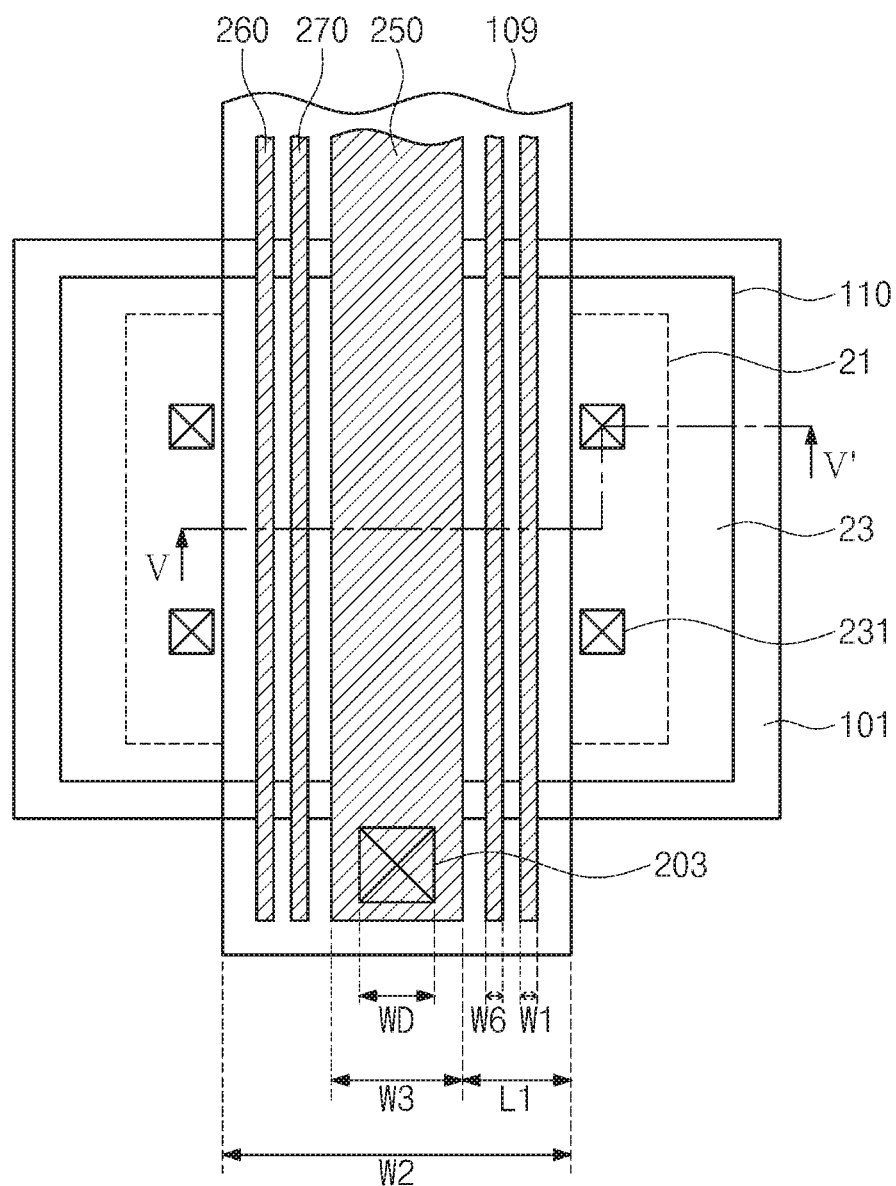
FIG. 4 is a plan view illustrating a semiconductor device according to an example embodiment of the present inventive concepts.
Figure 5:
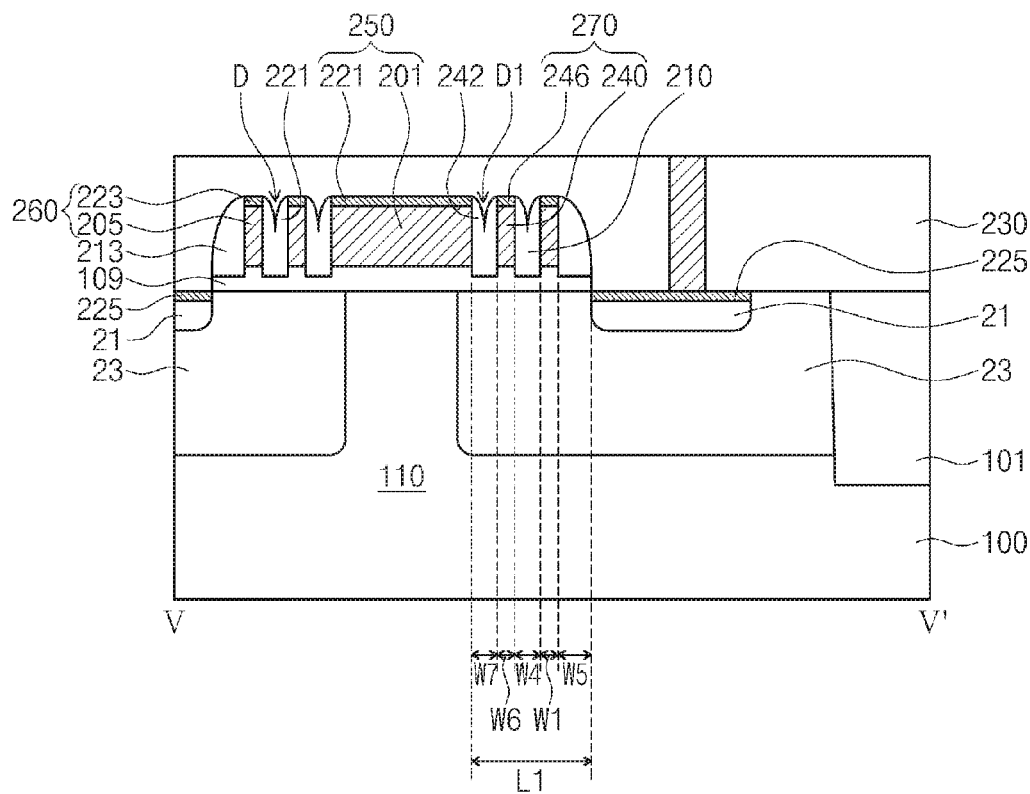
FIG. 5 is a cross-sectional view taken along line V-V' of FIG. 4 illustrating a semiconductor device according to an example embodiment of the present inventive concepts.

FIG. 4 is a plan view illustrating a semiconductor device according to an example embodiment of the present inventive concepts. FIG. 5 is a cross-sectional view taken along line V-V' of FIG. 4 illustrating a semiconductor device according to an example embodiment of the present inventive concepts. For brevity of the description, components substantially the same as those of the example embodiment illustrated in FIGS. 1 to 2 are allocated the same reference numerals, and a detailed description thereof may be omitted.

Referring to FIGS. 4 and 5, a second dummy conductive pattern 270 may be disposed between the gate conductive pattern 250 and the first spacer 210. The second dummy conductive pattern 270 may be spaced apart from the gate conductive pattern 250. The second dummy conductive pattern 270 may be disposed on the gate dielectric layer 109 and in contact with the top surface of the gate dielectric layer 109. The second dummy conductive pattern 270 may include a third conductive pattern 240 and a fourth metal silicide pattern 246 on the third conductive pattern 240. The second dummy conductive pattern 270 may have a width W6 less than the minimum width WD of the first contact plug 203. No contact plug may be disposed on the second dummy conductive pattern 270 so that the second dummy conductive pattern 270 may be in an electrically floating state without applied voltage. The second dummy conductive pattern 270 may have a thickness substantially the same as those of the gate and dummy conductive patterns 250 and 260. The second dummy conductive pattern 270 may have the same material as the gate and dummy conductive patterns 250 and 260. For example, the third conductive pattern 240 may include undoped polysilicon, doped polysilicon, or metal. The fourth metal silicide pattern 246 may include, for example, titanium silicide, tantalum silicide, tungsten silicide, nickel silicide, or cobalt silicide.

A third spacer 242 may be disposed between the gate conductive pattern 250 and the second dummy conductive pattern 270. The third spacer 242 may be disposed on the gate dielectric layer 109 and in contact with the top surface of the gate dielectric layer 109. The third spacer 242 may include a recess D1 at its upper portion. The recess D1 may correspond to a recessed top surface of the third spacer 242. The recess D1 may be recessed toward the substrate 100. The recess D1 may have a width whose size decreases with approaching the substrate 100. The recess D1 may have a V-type shape. For example, the recess D1 may be formed of convex inner surfaces facing each other. The third spacer 242 may have a width W7 substantially the same as a distance between the gate conductive pattern 250 and the second dummy conductive pattern 270. The distance L1 between the gate conductive pattern 250 and the first impurity region 21 may be substantially the same as a sum of the width W4 of the first spacer 210, the width W1 of the dummy conductive pattern 260, the width W5 of the second spacer 213, the width W6 of the second dummy conductive pattern 270, and the width W7 of the third spacer 242, e.g., L1=W1+W4+W5+W6+W7. The third spacer 242 may include the same material as the first and second spacers 210 and 213. The third spacer 242 may include an insulative material (e.g., a silicon oxide layer or a silicon nitride layer). In an example embodiment, the distance L1 between the gate conductive pattern 250 and the first impurity region 21 may be adjusted depending on characteristics of a semiconductor device, for example, by changing the number and widths of the dummy conductive patterns and the spacers.

Figure 6:
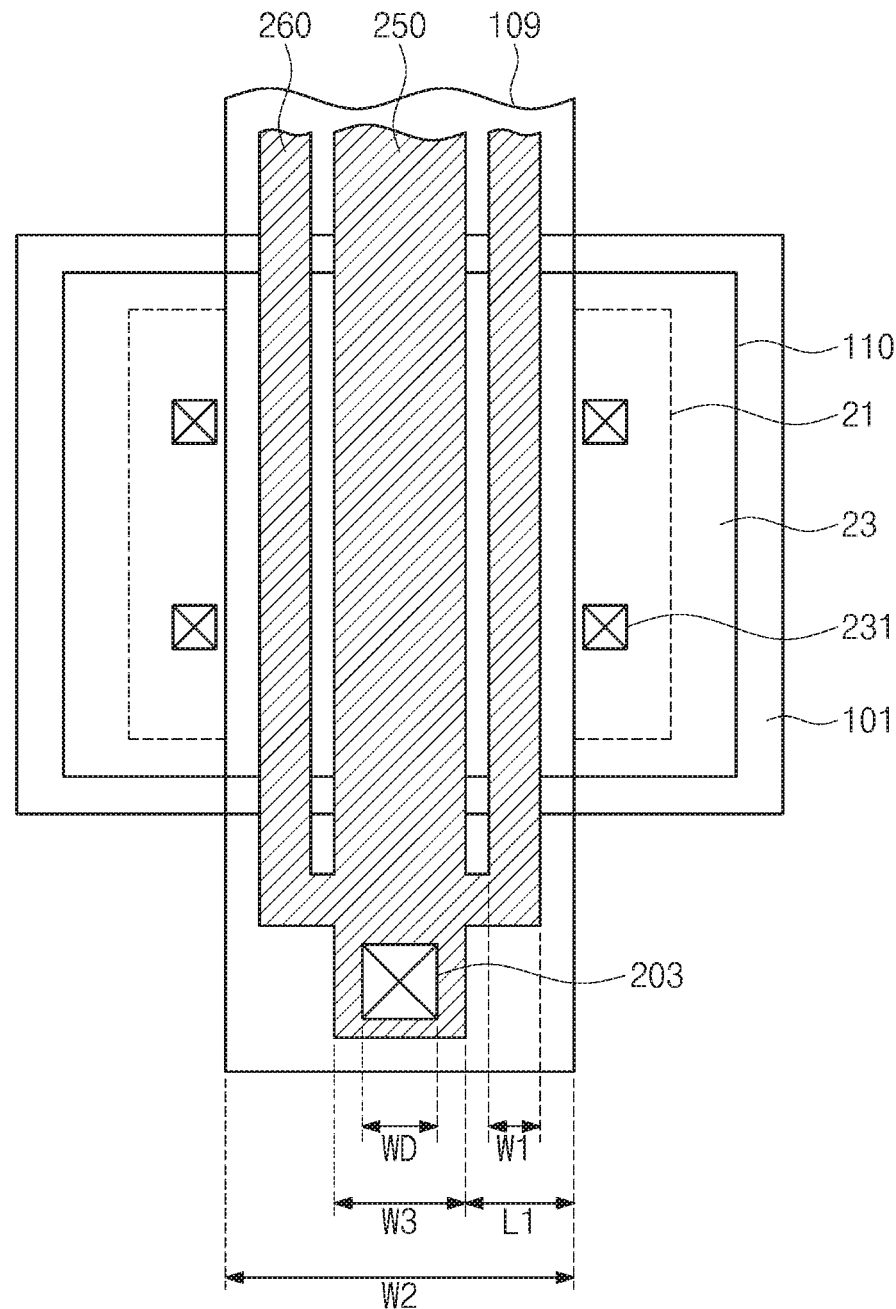
FIG. 6 is a plan view illustrating a semiconductor device according to an example embodiment of the present inventive concepts.

FIG. 6 is a plan view illustrating a semiconductor device according to an example embodiment of the present inventive concepts. For brevity of the description, components substantially the same as those of the embodiment illustrated in FIGS. 1 and 2 are allocated the same reference numerals thereto, and a detailed description thereof will be omitted.

Referring to FIG. 6, the dummy conductive pattern 260 may be physically connected to the gate conductive pattern 250. For example, the dummy conductive pattern 260 may have an end portion physically connected to the gate conductive pattern 250. Accordingly, when a voltage is applied to the first contact plug 203, a voltage may be applied to the gate conductive pattern 250 and the dummy conductive pattern 260. In an embodiment, when a voltage is applied to the dummy conductive pattern 260, impurity ions distributed in the second impurity region 23 of FIG. 2 may migrate toward a top surface of the substrate 100 below the dummy conductive pattern 260. An increased impurity concentration may be found in the second impurity region 23 between the gate conductive pattern 250 and the first impurity region 21. As such, when a voltage is applied to the gate conductive pattern 250, the second impurity region 23 between the gate conductive pattern 250 and the first impurity region 21 may have a decreased resistance and thus a large amount of current may flow through a channel.

FIGS. 7A to 7D are cross-sectional views, taken along line II-II' of FIG. 1, illustrating a method of fabricating a semiconductor device according to an example embodiment of the present inventive concepts.

Figure 7A:
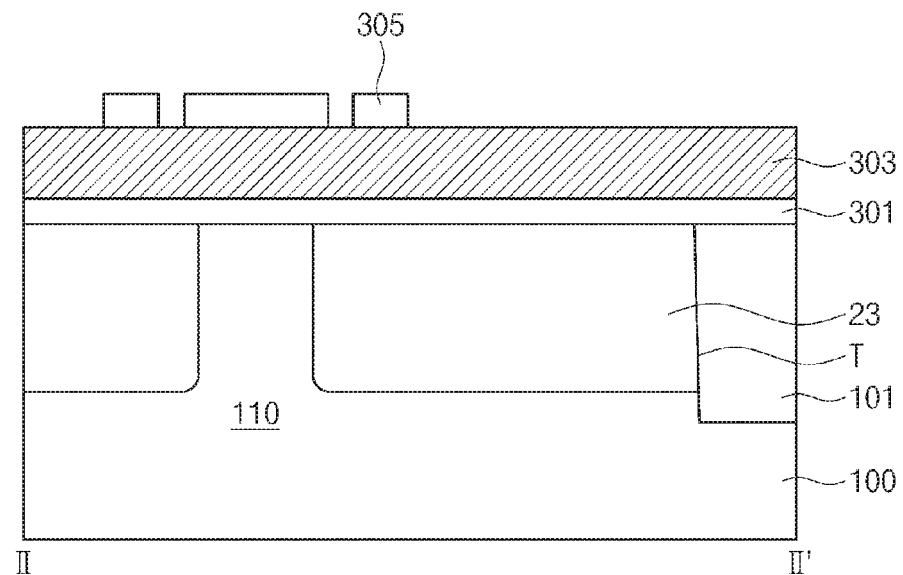
FIGS. 7A to 7D are cross-sectional views, taken along line II-II' of FIG. 1, illustrating a method of fabricating a semiconductor device according to an example embodiment of the present inventive concepts.

Referring to FIG. 7A, a device isolation layer 101 may be formed in a substrate 100. The device isolation layer 101 may define an active region 110 of the substrate 100. The device isolation layer 101 may be obtained by forming a trench T in the substrate 100 and then filling the trench T with an insulative material. The device isolation layer 101 may include an insulative material (e.g., a silicon oxide layer or a silicon nitride layer). A second impurity region 23 may be formed in the active region 110. For example, the second impurity region 23 may be formed by doping impurities into a portion of the active region 110. The second impurity region 23 may be doped with p-type or n-type conductive impurities.

An insulative layer 301 and a conductive layer 303 may be sequentially formed on the substrate 100. The insulative layer 301 may include a thermal oxide layer. The conductive layer 303 may include undoped polysilicon, doped polysilicon, or a conductive material. First mask patterns 305 may be formed on the active region 110. The first mask patterns 305 may include an insulative material (e.g., a silicon oxide layer or a silicon nitride layer).

Figure 7B:
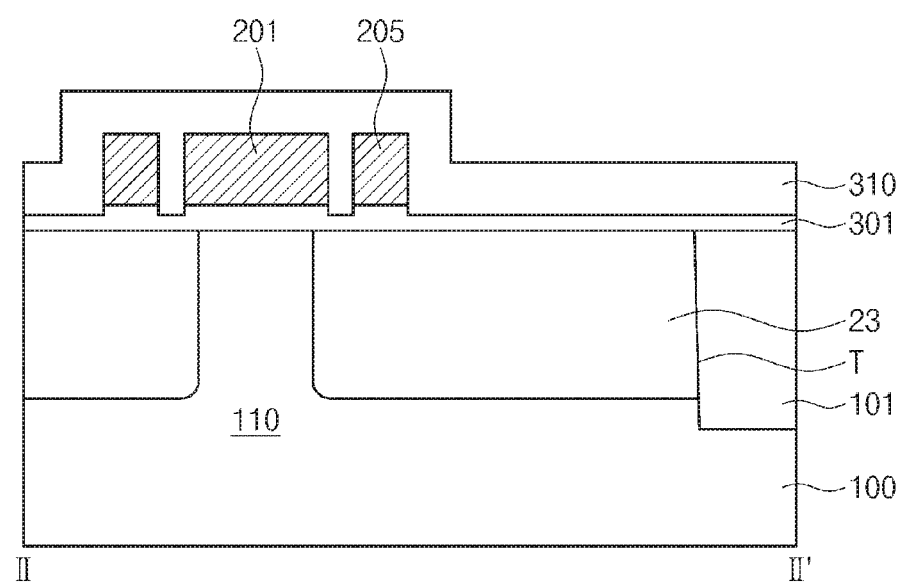

Referring to FIG. 7B, an etching process may be performed to pattern the conductive layer 303 using the first mask patterns 305 as an etching mask. Thus, first and second conductive patterns 201 and 205 may be formed on the active pattern 110. The first conductive pattern 201 may partially overlap the second impurity region 23, and the second conductive pattern 205 may completely overlap the second impurity region 23. The insulative layer 301 may not be patterned when the conductive layer 303 is patterned. Therefore, the insulative layer 301 may remain on the active region 110 between the first and second conductive patterns 201 and 205. For example, when the etching process is performed, the remaining insulative layer 301 may be over-etched to have a recessed top surface.

A spacer layer 310 may be formed on the insulative layer 301, the first conductive pattern 201, and the second conductive pattern 205. The spacer layer 310 may cover the top surface of the insulative layer 301, top and side surfaces of the first conductive pattern 201, and top and side surfaces of the second conductive pattern 205, and may fill a space between the first and second conductive patterns 201 and 205. As shown in FIG. 3, the spacer layer 310 may include a void 212. The void 212 may be formed between the first and second conductive patterns 201 and 205, and defined by the spacer layer 310. The spacer layer 310 may include an insulative material (e.g., a silicon oxide layer or a silicon nitride layer).

Figure 7C:
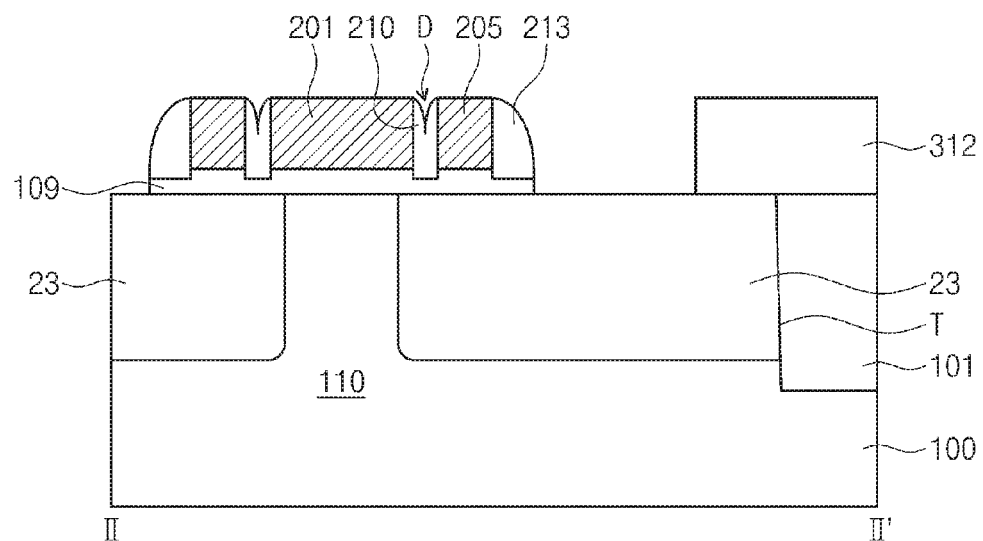

Referring to FIG. 7C, an etching process may be performed on the spacer layer 310 to form first and second spacers 210 and 213. An etch-back process may be selected as the etching process. The first spacer 210 may be formed on opposite sidewalls of the first conductive pattern 201 and one sidewall of the second conductive pattern 205, and the second spacer 213 may be formed on an opposite sidewall of the second conductive pattern 205. The first and second spacers 210 and 213 may have shapes different from each other. The first spacer 210 may include at its upper portion a recess D that is recessed toward the substrate 100. The first spacer 210 may completely fill a space between the first and second conductive patterns 201 and 205.

The insulative layer 301 may be patterned using the first conductive pattern 201, the first spacer 210, the second conductive pattern 205, and the second spacer 213 as an etching mask. Thus, a gate dielectric layer 109 may be formed on the active region 110. The gate dielectric layer 109 may be formed between the active region 110 and each of the first conductive pattern 201, the first spacer 210, the second conductive pattern 205, and the second spacer 213. After the gate dielectric layer 109 is formed, a second mask pattern 312 may be formed on the substrate 100. The second mask pattern 312 may include an insulative material (e.g., a silicon oxide layer or a silicon nitride layer).

Figure 7D:
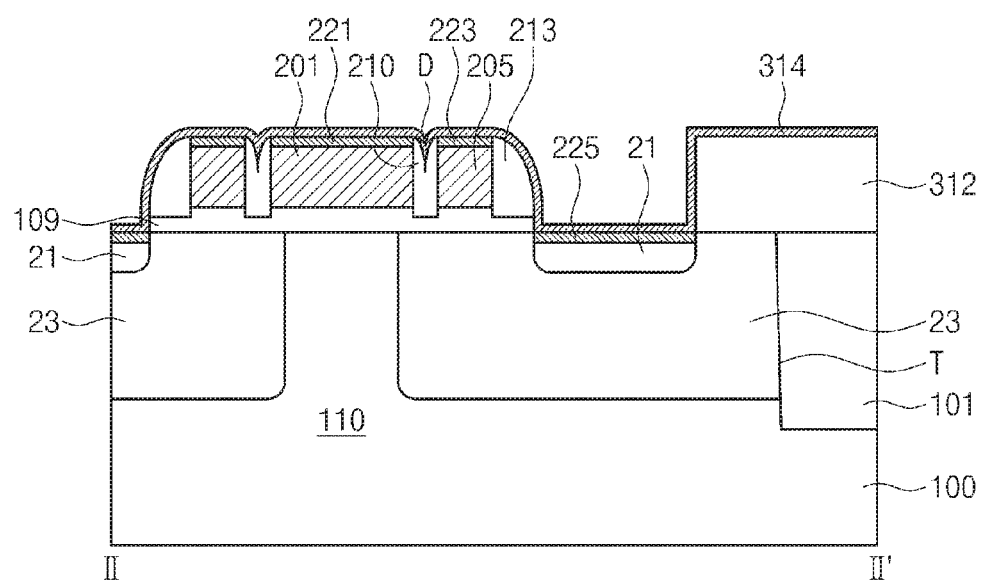

Referring to FIG. 7D, a first impurity region 21 may be formed in the second impurity region 23. The first impurity region 21 may be formed by doping impurities into the second impurity region 23 using the first conductive pattern 201, the first spacer 210, the second conductive pattern the second spacer 213, and the second mask pattern 312 as a mask. The first impurity region 21 may have a doping concentration greater than that of the second impurity region 23. The first impurity region 21 may have the same conductivity as the second impurity region 23.

A metal layer 314 may be formed on top surfaces of the first conductive pattern 201, the first spacer 210, the second conductive pattern 205, the second spacer 213, and the first impurity region 21. The metal layer 314 may include at least one of cobalt (Co), nickel (Ni), tantalum (Ta), titanium (Ti), tungsten (W), platinum (Pt), hafnium (Hf), palladium (Pd), or vanadium (V). The metal layer 314 may be formed by a deposition process (e.g., PVD, ALD). Although not shown figures, before the metal layer 314 is formed, a removal process may be performed to remove a native oxide layer formed on the top surfaces of the first impurity region 21, the first conductive pattern 201, and the second conductive pattern 205.

A silicidation process may be performed to form a first metal silicide pattern 221, a second metal silicide pattern 223, and a third metal silicide pattern 225 on the first conductive pattern 201, the second conductive pattern 205, and the first impurity region 21, respectively. The silicidation process may include performing a heat treatment (e.g., RTA (Rapid Thermal Annealing)) on the metal layer 314 to react metal ions of the metal layer 314 with silicon (Si) ions. The first to third metal silicide pattern 221, 223 and 225 may include, for example, titanium silicide, tantalum silicide, tungsten silicide, nickel silicide, or cobalt silicide. After the first to third metal silicide patterns 221, 223 and 225 are formed, the metal layer 314 and the second mask pattern 312 may be removed.

According to an example embodiment of the present inventive concepts, the first conductive pattern 201, the second conductive pattern 205, the first spacer 210, and the second spacer 213 may serve as a mask for an ion implantation process for forming the first impurity region 21. Thus, mask alignment may not be needed to form the first impurity region 21, which is spaced apart at a distance (see L1 of FIG. 2) from the gate conductive pattern (see 250 of FIG. 2). Also, a single silicidation process may form the first and third metal silicide patterns 221 and 225 on the first conductive pattern 201 and the first impurity region 21, respectively, using the second conductive pattern 205, the first spacer 210, and the second spacer 213 as a mask. Therefore, the number of process steps for fabricating a semiconductor device may be reduced.

Referring back to FIGS. 1 and 2, an interlayer dielectric layer 230 may be formed on the substrate 100, the first metal silicide pattern 221, the first spacer 210, the second metal silicide pattern 223, and the second spacer 213. The interlayer dielectric layer 230 may include an insulative material (e.g., a silicon oxide layer or a silicon nitride layer). A first contact plug 203 and a second contact plug 231 may be formed on the first metal silicide pattern 221 and the first impurity region 21, respectively. The first and second contact plugs 203 and 231 may be formed in the interlayer dielectric layer 230. The first contact plug 203 may be electrically connected to the first conductive pattern 201 and the first metal silicide pattern 221, and the second contact plug 231 may be electrically connected to the first impurity region 21.

According to an example embodiment of the present inventive concepts, the first impurity region spaced apart from the gate conductive pattern may be formed using the gate conductive pattern, the dummy conductive pattern, and the spacers as a mask, without using a separate mask alignment. Also, the metal silicide patterns on the gate conductive pattern and the first impurity region may be formed in a single silicidation process using the dummy conductive pattern and the spacers as a mask. Therefore, the number of process steps for fabricating a semiconductor device may be reduced.

Although the present inventive concepts have been described in connection with some example embodiments illustrated in the accompanying drawings, it is not limited thereto. It will be apparent to those skilled in the art that various substitution, modifications, and changes may be thereto without departing from the scope and spirit of the inventive concepts.

What is claimed is:
1. A semiconductor device comprising:
a device isolation layer in a substrate, the device isolation layer defining an active region;
a first conductive pattern on the active region;
an impurity region in the active region, the impurity region on a side of the first conductive pattern;
a second conductive pattern on the active region, the second conductive pattern between the impurity region and the first conductive pattern;
a first spacer between the first conductive pattern and the second conductive pattern;
a contact plug on the first conductive pattern, the contact plug electrically connected to the first conductive pattern, a width of the second conductive pattern being less than a width of the contact plug; and
a second spacer, on a side wall of the second conductive pattern,
wherein the first spacer includes a void, and the second spacer is substantially free of a void.

2. The semiconductor device of claim 1, wherein the first and second conductive patterns comprise a same material.

3. The semiconductor device of claim 1, further comprising:
a third conductive pattern on the active region, the third conductive pattern between the second conductive pattern and the impurity region, a width of the third conductive pattern being less than the width of the contact plug; and
a second spacer between the second conductive pattern and the third conductive pattern.

4. The semiconductor device of claim 1, wherein the first conductive pattern is in an electrically floating state.

5. The semiconductor device of claim 1, further comprising:
a gate dielectric layer between the first conductive pattern and the active region, between the first spacer and the active region, and between the second conductive pattern and the active region.

6. The semiconductor device of claim 5, wherein the first spacer and the second conductive pattern are in contact with a top surface of the gate dielectric layer.

7. The semiconductor device of claim 1, wherein the void included in the first spacer is closed by the first spacer.

8. A semiconductor device comprising:
a device isolation layer in a substrate, the device isolation layer defining an active region;
a gate conductive pattern on the active region;
an impurity region in the active region, the impurity region on a side of the gate conductive pattern;
a dummy conductive pattern on the active region, the dummy conductive pattern between the impurity region and the gate conductive pattern;
a first spacer between the gate conductive pattern and the dummy conductive pattern; and
a gate dielectric layer between the gate conductive pattern and the active region, the gate dielectric layer extending between the first spacer and the active region and between the dummy conductive pattern and the active region,
wherein the gate dielectric layer has a recessed top surface between the gate conductive pattern and the dummy conductive pattern, and
a bottom surface of the first spacer on the recessed top surface is lower than a bottom surface of the gate conductive pattern.

9. The semiconductor device of claim 8, wherein the first spacer comprises a recess at an upper portion thereof.

10. The semiconductor device of claim 9, wherein the recess has a width whose size decreases with approaching the substrate.

11. The semiconductor device of claim 9, wherein the recess is defined by convex inner surfaces facing each other.

12. The semiconductor device of claim 8, wherein a width of the first spacer is same as a distance between the gate conductive pattern and the dummy conductive pattern.

13. The semiconductor device of claim 8, wherein the first spacer includes a void, which is closed by the first spacer.

14. The semiconductor device of claim 8, further comprising:
a third metal silicide pattern on the impurity region, wherein
the gate conductive pattern comprises a first metal pattern and a first metal silicide pattern on the first metal pattern,
the dummy conductive pattern comprises a second metal pattern and a second metal silicide pattern on the second metal pattern, and
the first to third metal silicide patterns include, a same material.

15. The semiconductor device of claim 8, wherein the bottom surface of the first spacer is spaced apart from a top surface of the active region.

16. A semiconductor device comprising:
a substrate including an active region;
a gate conductive, pattern on the active region;
a first impurity region in the active region, the first impurity region including impurities of a first conductive type;
a second impurity region in the active region, the second impurity region at one side of the gate conductive pattern and surrounding the first impurity region, the second impurity region including impurities of the first conductive type, the first impurity region having a greater impurity concentration than the second impurity region;
at least one auxiliary conductive pattern on the active region, the at least one auxiliary conductive pattern between the first impurity region and the gate conductive pattern, the at least one auxiliary conductive pattern having a first width;
a first spacer between the gate conductive pattern and the auxiliary conductive pattern;
a contact plug connected to the gate conductive pattern, the contact plug having a second width, the first width being smaller than the second width; and
a second spacer on a side wall of the at least one auxiliary conductive pattern,
wherein the first spacer includes a void, and the second spacer is substantially free of a void.

17. The semiconductor device of claim 16, wherein the gate conductive pattern partially overlaps the second impurity region, and the at least e auxiliary conductive pattern fully overlaps the second impurity region.

18. The semiconductor device of claim 16, wherein the second spacer is horizontally between the at least one auxiliary conductive pattern and the first impurity region.

19. The semiconductor device of claim 16, wherein the at least one auxiliary conductive pattern includes a plurality of auxiliary conductive patterns, and the plurality of auxiliary conductive patterns include third spacers therebetween.

20. The semiconductor device of claim 16, wherein the first spacer and the second spacer have substantially different shapes from each other.

* * * * *